(12) United States Patent
Wölfel

(10) Patent No.: US 10,627,429 B2
(45) Date of Patent: Apr. 21, 2020

(54) PRINTED CIRCUIT BOARD WITH AT LEAST ONE INTEGRATED PRECISION RESISTOR

(71) Applicant: JUMATECH GMBH, Eckenthal (DE)

(72) Inventor: Markus Wölfel, Lauf (DE)

(73) Assignee: JUMATECH GMBH, Eckenthal (DE)

( * ) Notice: Subject to any disclaimer, the term of this patent is extended or adjusted under 35 U.S.C. 154(b) by 44 days.

(21) Appl. No.: 15/035,675

(22) PCT Filed: Nov. 13, 2014

(86) PCT No.: PCT/EP2014/074506
§ 371 (c)(1),
(2) Date: May 10, 2016

(87) PCT Pub. No.: WO2015/071367
PCT Pub. Date: May 21, 2015

(65) Prior Publication Data
US 2016/0282389 A1    Sep. 29, 2016

(30) Foreign Application Priority Data
Nov. 13, 2013    (DE) .................. 10 2013 223 143

(51) Int. Cl.
*G01R 17/02*    (2006.01)
*H01C 7/06*    (2006.01)
(Continued)

(52) U.S. Cl.
CPC .............. *G01R 17/02* (2013.01); *H01C 7/06* (2013.01); *H05K 1/0265* (2013.01);
(Continued)

(58) Field of Classification Search
CPC ...... G01R 17/02; G01R 1/203; H05K 3/4644; H05K 3/328; H05K 3/0017; H05K 1/0265;
(Continued)

(56) References Cited

U.S. PATENT DOCUMENTS 2,421,688 A * 6/1947 Dorst .................. H01C 3/02
174/110 R
4,771,233 A * 9/1988 Wayne ............... G01R 1/07307
324/123 C
(Continued)

FOREIGN PATENT DOCUMENTS

CN    102461359 A    5/2012
DE    102008022787 A1    2/2009
(Continued)

OTHER PUBLICATIONS

International Search Report for PCT/EP2014/074506 dated Apr. 13, 2015 and English Translation of ISR, 6 pages.
(Continued)

*Primary Examiner* — Christopher P McAndrew
*Assistant Examiner* — Zannatul Ferdous
(74) *Attorney, Agent, or Firm* — Troutman Sanders LLP

(57) ABSTRACT

The invention relates to a printed circuit board (1) with at least two connection points (3) and at least one precision resistor (2) for measuring a current flowing between the connection points. The aim of the invention is to inexpensively produce a printed circuit board of the type mentioned in the introduction such that the printed circuit board has a reduced installation space while simultaneously having a preferably long service life. According to the invention, this is achieved in that the precision resistor extends between the connection points in the printed circuit board (11). The
(Continued)

invention additionally relates to a corresponding method for producing said printed circuit board.

6 Claims, 1 Drawing Sheet

(51) Int. Cl.
*H05K 3/32* (2006.01)
*H05K 3/46* (2006.01)
*H05K 1/18* (2006.01)
*H05K 3/00* (2006.01)
*H05K 1/02* (2006.01)
*H05K 3/10* (2006.01)
*G01R 1/20* (2006.01)
*H05K 1/11* (2006.01)

(52) U.S. Cl.
CPC ............ *H05K 1/0268* (2013.01); *H05K 1/185* (2013.01); *H05K 3/0017* (2013.01); *H05K 3/328* (2013.01); *H05K 3/4644* (2013.01); *G01R 1/203* (2013.01); *H05K 1/115* (2013.01); *H05K 3/103* (2013.01); *H05K 2201/093* (2013.01); *H05K 2201/0979* (2013.01); *H05K 2201/10022* (2013.01); *H05K 2201/10151* (2013.01); *H05K 2201/10272* (2013.01); *H05K 2203/0455* (2013.01)

(58) Field of Classification Search
CPC ................. H05K 1/0268; H05K 1/185; H05K 2201/10151; H05K 3/103; H05K 1/115; H05K 2201/10272; H05K 2203/0455; H05K 3/36; H05K 2201/10022; H01C 7/06
See application file for complete search history.

(56) References Cited

U.S. PATENT DOCUMENTS

2004/0207989 A1   10/2004   Fauh et al.
2005/0057865 A1   3/2005    Veloo et al.
2009/0044403 A1*  2/2009    Fauh .................. H05K 1/0265
                                                29/830

FOREIGN PATENT DOCUMENTS

DE   102008059694 A1   6/2010
EP   2843405 A3        4/2015
JP   03245486 A        1/1991
JP   09148051 A        6/1997
WO   2004/077904 A1    9/2004
WO   2013/002308 A1    1/2013

OTHER PUBLICATIONS

Leiton GmbH—Lagenaufbauten Rev. 4.3—FR4-Leiterplatten, Sep. 18, 2013, Firmenschrift, www.leiton.de/formulare/Lagenaufbauten, 42 pages.
Office Action Issued in DE 10 2013 223 143.1 dated Aug. 18, 2014, 8 pages.
Written Opinion of PCT/EP2014/074506 dated, 5 pages.
Communication issued by the European Patent Office in European Patent Application No. 14798840.6, dated Feb. 13, 2018, 7 pages total.
Widerstandsbereich, "Widerstände Strommess—Widerstande (Shunt) Serie MST Spezifikation MST-1 MST-2 MST-5" (2013) XP055448179, 3 pages total.
Communication issued by the Chinese State Intellectual Property Office in Chinese Application No. 201480061970.0, dated Jan. 2, 2018, 9 pages total.
Communication issued by the China National Intellectual Property Administration in Chinese Application No. 201480061970.0, dated Nov. 2, 2018, 9 pages total.
Communication issued by the Japanese Patent Office in Japanese Application No. 2016-530851, dated Nov. 20, 2018, 8 pages total.
Communication (Third Office Action) issued by the State Intellectual Property Office of the People's Republic of China in Chinese Patent Application No. 201480061970.0, dated May 7, 2019, 9 pages total.
Communication issued by the Japan Patent Office in Japanese Application No. 2016-530851, dated Mar. 12, 2019, 7 pages total.
Communication (Third Office Action) issued by the State Intellectual Property Office of the People's Republic of China in Chinese Patent Application No. 201480061970.0, dated Oct. 28, 2019, 11 pages total.

* cited by examiner

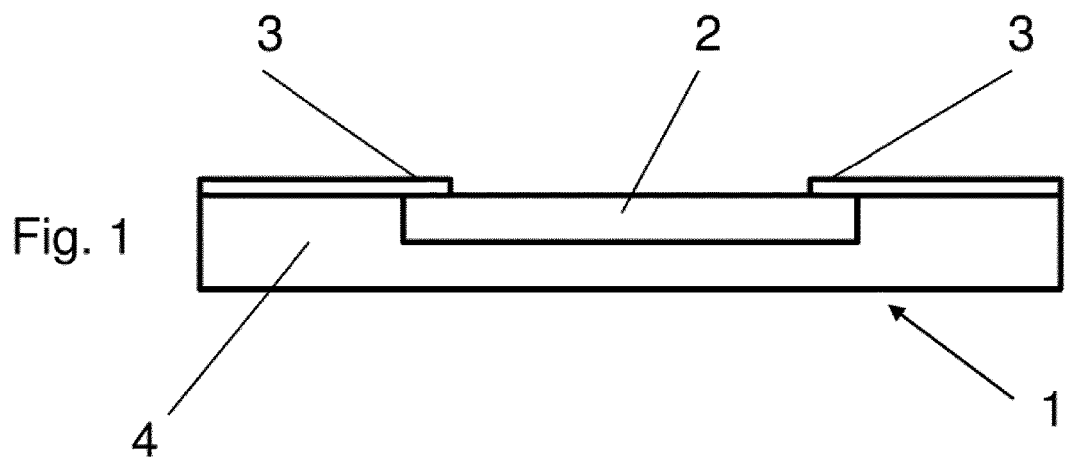
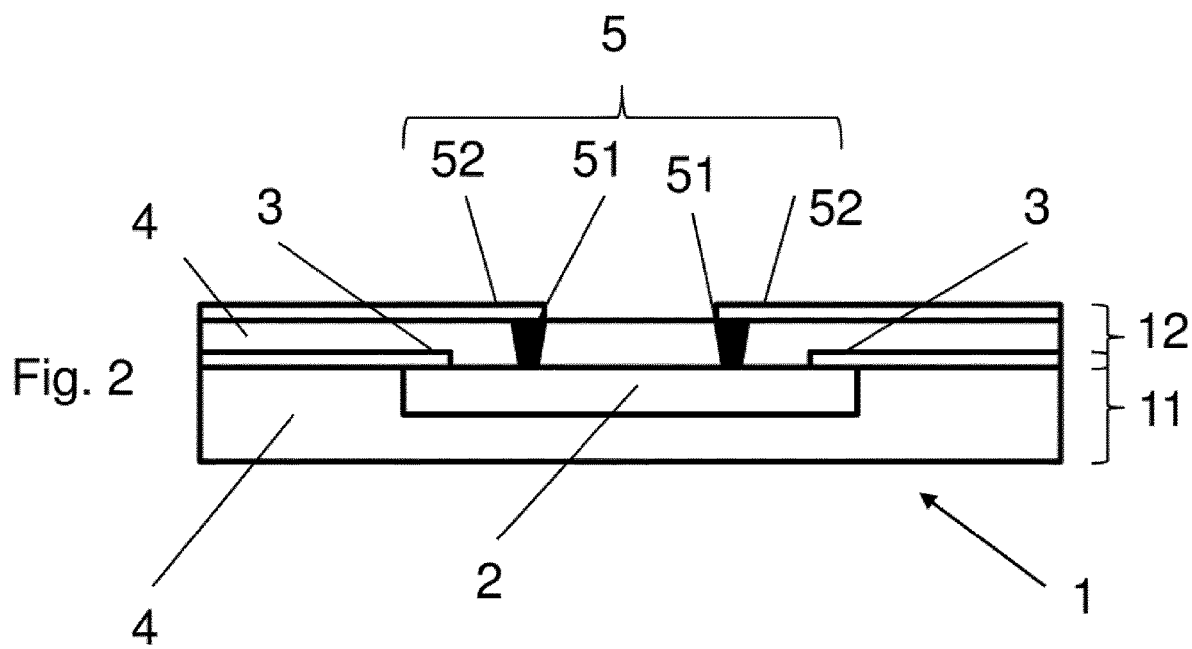

under 35 U.S.C. § 371 of International Patent Application No. PCT/EP2014/074506, filed on Nov. 13, 2014, and claims the benefit of German Patent Application No. 10 2013 223 143.1, filed on Nov. 13, 2013, both of which applications are incorporated herein by reference in their entireties.

PRINTED CIRCUIT BOARD WITH AT LEAST ONE INTEGRATED PRECISION RESISTOR

CROSS-REFERENCE TO RELATED APPLICATIONS

This application is the U.S. National Phase application under 35 U.S.C. § 371 of International Patent Application No. PCT/EP2014/074506, filed on Nov. 13, 2014, and claims the benefit of German Patent Application No. 10 2013 223 143.1, filed on Nov. 13, 2013, both of which applications are incorporated herein by reference in their entireties.

FIELD OF THE INVENTION

The invention relates to a printed circuit board with at least two connection points and at least one precision resistor for measuring a current flowing between the connection points.

BACKGROUND

Such printed circuit boards with a precision resistor as part of a measuring device for the current flowing between the connection points are known from prior art. The precision resistor, which is composed, for example, of solid electron-beam-welded composite made from copper and resistance alloys, is as a surface-mount device (SMD) soldered onto an existing circuit or connected via bonding wires. By measuring the voltage between connection points and due to the known electric resistance value, which generally varies only slightly due to the extremely low temperature coefficient of the materials used in the relevant temperature range of 20 to 60° C., the current flowing between the connection points can be determined with high accuracy.

The manufacture of these printed circuit boards is comparatively complex and expensive. Connecting the precision resistor at the connection points is often also susceptible to vibrations which can reduce the service life of the printed circuit board. In addition, the trend in many technical applications (for example, automotive, smartphone, etc.) is toward minimizing the size ("downsizing") which limits in particular the installation space of the electrical components, such as printed circuit boards, used for this purpose.

The invention is therefore based on the object to inexpensively produce a printed circuit board of the type mentioned above such that the printed circuit board has a reduced installation space while having a preferably long service life.

SUMMARY

The object of the invention is satisfied by the printed circuit board having at least two connection points and at least one precision resistor for measuring a current flowing between the connection points, where the precision resistor extends between the connection points in the printed circuit board. The arrangement of the precision resistor in the printed circuit board firstly reduces the installation space and secondly significantly reduces the production costs as well as the susceptibility of the printed circuit board to external influences such as vibration. This allows the printed circuit board to be produced in a more inexpensive, compact and durable manner than conventional products.

It can be advantageous to have the printed circuit board comprise at least one layer of insulating material, where the thickness of the at least one layer of insulating material is preferably in the range from 50 to 2000 µm, preferably in the range from 100 to 1800 µm, more preferably in the range from 800 to 1600 µm.

It can also prove to be useful to have circuit electronics and/or power electronics be disposed on the printed board circuit. The manufacturing technique according to the invention for printed circuit boards is particularly suitable for use in the field of circuit electronics and/or power electronics, as e.g. large heat and power levels are manageable via conductor wires and/or conductor moldings embedded into the printed circuit board.

According to one advantageous embodiment of the invention, the precision resistor satisfies at least one of the following requirements:

- The precision resistor is connected to the connection points.
- The precision resistor is welded to the connection points.
- The precision resistor comprises a resistance value in the range from 0.1 to 300 milliohms, preferably in the range from 1 to 100 milliohms.
- The precision resistor comprises a variance of less than +/−5%, particularly a variance of less than +/−2%, preferably a variance of +/−1% or less.
- The temperature coefficient of the electrical resistance of the precision resistor for the temperature range between 20 and 60° C. is in the range from 0.1 ppm/K to 200 ppm/K, particularly in the range from 0.5 ppm/K to 100 ppm/K, preferably in the range from 1 ppm/K to 50 ppm/K.
- The precision resistor is made of metal, preferably of at least one of the elements copper (Cu), manganese (Mn), nickel (Ni), chromium (Cr), aluminum (Al), silicon (Si) or tin (Sn), preferably of an alloy containing at least one of the elements copper (Cu), manganese (Mn), nickel (Ni), chromium (Cr), aluminum (Al), silicon (Si) or tin (Sn), for example, Manganin, Zeranin or Isaohm.
- The precision resistor is at least predominantly, preferably entirely, embedded into the printed circuit board.
- An upper side and/or an underside and/or at least one of the edge sides of the precision resistor, preferably all edge sides of the precision resistor, is/are at least partially, preferably entirely, covered with insulating material.
- An upper side and/or an underside and/or at least one of the edge sides of the precision resistor extends at least in sections, preferably entirely, flush with an upper side and/or an underside and/or at least one of the edge sides of an adjacent layer of insulating material.
- The upper sides and/or the undersides and/or at least one of the edge sides of the printed circuit board and of the precision resistor are each aligned parallel to each other.
- The precision resistor can be manufactured or is manufactured in an extrusion process.
- The precision resistor is configured as a flat wire.
- The precision resistor extends substantially in one plane.
- The precision resistor comprises a rectangular cross-section, where preferably the side of the cross-section with the larger dimension faces the surface of the printed circuit board.
- The precision resistor is as a molding detached from a plate-shaped workpiece, preferably by punching, eroding or separating, for example by water jet cutting, where the molding is formed to be preferably substantially L-shaped, T-shaped, H-shaped, S-shaped, O-shaped, E-shaped, F-shaped, X-shaped, Y-shaped, Z-shaped, C-shaped, U-shaped or Q-shaped.

The precision resistor has a thickness in the range from 10 to 2000 μm, particularly in the range from 50 to 1000 μm, preferably in the range from 100 to 500 μm.

There are various configuration options for the precision resistor which are to be covered by the scope of protection of the invention. What is crucial is that the precision resistor extends between the connection points in the printed circuit board, where the configuration of the precision resistor as a conductor wire, flat wire, or as molding seems most advantageous for reasons of costs or manufacturing requirements. The configuration of the precision resistor as a conductor wire, flat wire or molding also has the advantage that the connection at the connection points can be effected with large contact surfaces so that only low power losses, which could adversely affect current measurement, arise via the connection.

It can prove to be advantageous to have the printed circuit board comprise a voltage measuring device that satisfies at least one of the following requirements:
 The voltage measuring device is adapted to measure a voltage at the connection points, preferably at the contact points between the precision resistor and the connection points.
 The voltage measuring device realizes an HDI (High Density Interconnect) circuit, preferably with at least one of the following features:
  The precision resistor and/or the connection points is/are covered by at least one layer of insulating material.
  A bore for connecting the precision resistor through at least one layer of insulating material is preferably formed by laser drilling.
  The precision resistor is connected through at least one layer of insulating material, preferably via microvias.
  The precision resistor is galvanically connected.

The configuration of the voltage measuring device as an HDI (High Density Interconnect) circuit proves to be particularly advantageous in connection with particularly low-resistance precision resistors, since the connection can be effected very precisely.

The object of the invention is also satisfied by a method for manufacturing a printed circuit board with at least one precision resistor extending in the printed circuit board for measuring a current flowing between connection points, comprising the steps of:
 Connecting the precision resistor at the connection points.
 Covering the precision resistor with electrically insulating material.
 Electrically insulating the connection points from each other so that a current flowing between the connection points flows through the precision resistor.

According to an advantageous embodiment, the method comprises at least one of the following steps:
 Welding the precision resistor to the connection points.
 Pressing a prepreg made of insulating material to the precision resistor.
 Working out the connection points and/or fabricating conductor tracks, preferably for a voltage measuring device, by way of etching from a copper foil attached to the surface of the printed circuit board, where etching the copper foil preferably occurs after connecting the precision resistor to the connection points.
 Manufacturing a voltage measuring device, preferably by realizing an HDI (High Density Interconnect) circuit on the printed circuit board, preferably with at least one of the following steps:
  Covering the precision resistor and/or the connection points with at least one layer of insulating material.
  Producing a bore for connecting the precision resistor through at least one layer of insulating material, preferably by laser drilling.
  Connecting the precision resistor through at least one layer of insulating material, preferably via microvias.
  Galvanically connecting the precision resistor.

Further advantageous developments of the invention shall arise from combinations of the features disclosed in the claims, the description and the drawings.

BRIEF DESCRIPTION OF THE FIGURES

FIG. 1 shows a schematic sectional view of a printed circuit board according to the first embodiment of the invention, where the printed circuit board comprises a substrate with a layer of insulating material and embedded therein a precision resistor in the range of 100 milliohms, where conductor tracks having end side connection points extend on the upper side of the printed circuit board and the connection points are welded to the precision resistor.

FIG. 2 shows a schematic sectional view of a printed circuit board according to the second embodiment of the invention, where the printed circuit board comprises a substrate with two layers of insulating material and, embedded into the lower layer, a precision resistor in the range of 1 milliohm, where conductor tracks having end side connection points extend between the upper and the lower layer of insulating material and the connection points are welded to the precision resistor, where the precision resistor is galvanically connected through the upper layer of insulating material via conductor tracks and microvias for accomplishing a voltage measuring device in the form of an HDI circuit.

The illustrations of the printed circuit boards in the figures are schematic in nature. The proportions among the individual components of the printed circuit boards may therefore not be realistic.

DETAILED DESCRIPTION OF THE PREFERRED EMBODIMENTS

The preferred embodiments of the invention are described in detail below with reference to the figures.

First Embodiment (FIG. 1)

The first embodiment of the invention according to FIG. 1 relates to a printed circuit board 1 with two connection points 3 and a precision resistor 2 for measuring a current flowing between the two connection points 3. According to the invention, precision resistor 2 extends between connection points 3 in printed circuit board 1. Printed circuit board 1 comprises a layer of insulating material 4 having a thickness of approx. 1000 μm into which precision resistor 2 is embedded. The underside, all edge sides and a major part of the upper side of precision resistor 2 are entirely covered with insulating material 4. The upper side of precision resistor 2 at least in sections, in particular at the ends connected to connection points 3, extends flush with an upper side of the surrounding and adjoining layer of insulating material 4.

Disposed on printed circuit board 1 are, for example, circuit electronics and/or power electronics (not shown). Precision resistor 2 being welded to two connection points 3 is configured as a flat wire of Manganin and comprises a resistance value of approx. 100 milliohms at a variance of +/−5% or less. The temperature coefficient of the electrical resistance of precision resistor 2 for the temperature range between 20 and 60° C. is at approx. 5 ppm/K. The cross-section of precision resistor 2 being formed as a flat wire is rectangular having a thickness of approx. 100 μm and a width of approx. 500 μm, where the side of the cross-section with the larger dimension faces the surface of printed circuit board 1. This results in large contact surfaces on the two connection points 3 to precision resistor 2.

The voltage measuring device (not shown) is adapted to read a voltage at connection points 3 and directly measure it at the contact points between precision resistor 2 and connection points 3. The distance between the two contact points is precisely defined. Due to the electrical resistance of precision resistor 2 being known and very constant over the relevant temperature range, the current flowing between connection points 3 can be determined very accurately.

A method according to the invention for manufacturing printed circuit board 1 with precision resistor 2 extending in printed circuit board 1 for measuring the current flowing between connection points 3 comprises the steps of:

step a: connecting precision resistor 2 made of Manganin and formed as a flat wire, which, for example, has a thickness of approx 100 μm and a width of 500 μm, with a copper foil, which, for example, has a thickness of approx. 35 μm, at predetermined connection points 3 by welding.

step b: applying a layer of insulating material 4 to the side of the foil that is connected to precision resistor 2 by pressing a prepreg made of insulating material.

step c: working out connection points 3 and/or working out conductor tracks, for example, for a voltage measuring device, in one process step by etching from a copper foil that is attached to the surface of printed circuit board 1 or attached to the layer of insulating material 4, in order to electrically insulate connection points 3 from each other, so that a current flowing between connection points 3 flows through precision resistor 2.

Same reference numerals are hereinafter used for same elements to avoid any repetition of the description.

Second Embodiment (FIG. 2)

The second embodiment of the invention according to FIG. 2 is essentially based on the first embodiment that was previously described in connection with FIG. 1. Printed circuit board 1 according to the second embodiment of the invention is intended in particular for high precision current measurements in the low-resistance range and comprises two layers composed substantially of insulating material 4. The structure of the lower layer of printed circuit board 1 of the second embodiment substantially matches that of printed circuit board 1 of the first embodiment. The dimensions and the resistance values of precision resistor 2, having a thickness of approx. 300 μm and a width of approx. 1400 μm and 1 milliohm, respectively, differ from the first embodiment. To measure the voltage, a differently configured voltage measurement device 5 is therefore employed, as described below.

Lower layer 11 of printed circuit board 1 is coated with a layer of insulating material 4 that covers precision resistor 2 and connection points 3. On the upper side of upper layer 12 of printed circuit board 1 or respectively the upper layer made of insulating material 4, which has a thickness of preferably approx. 100 μm, a conductor circuit diagram with respective connections 52 to microvias 51 for measuring voltage according to the method described above is by etching worked out from a copper foil having a thickness of preferably approx. 18 μm. Voltage measuring device 5 realizes an HDI High Density Interconnect circuit, where laser bores through the upper layer made of insulating material for contacting precision resistor 2 are incorporated. Precision resistor 2 is via these bores galvanically connected by use of microvias 51. The spacing of microvias 51 is precisely defined, so that the resistance value can be determined precisely by way of the length of precision resistor 2 disposed therebetween. The current flowing between connection points 52 and microvias 51, respectively, can be precisely calculated by way of voltage measurement in connection with the precisely determined resistance value.

The invention is not restricted to the above embodiments. Further advantageous developments of the invention arise in particular from the additional use of conductor wires or moldings embedded into the printed circuit board, preferably in combination with etched conductor track. This allows electronic components to be interconnected on the printed circuit board.

The invention claimed is:

1. A printed circuit board comprising:
   at least two connection points and at least one precision resistor for measuring a current flowing between said connection points, and
   at least one layer of insulating material,
   wherein said precision resistor is welded to and extends between said connection points in said printed circuit board,
   wherein said precision resistor is configured as a conductor wire,
   wherein said precision resistor is embedded into said layer of insulating material so that an underside, all edge sides and a major part of an upper side of said precision resistor are entirely covered with insulating material, and
   wherein the upper side of said precision resistor extends at least in sections flush with an upper side of said layer of insulating material,
   wherein said upper side of said precision resistor and said upper side of said layer of insulating material face towards the same direction, and
   wherein an underside of said connection points contacts the upper side of said precision resistor and the upper side of said layer of insulating material, while an upper side of said connection points contacts neither said precision resistor nor said layer of insulating material.

2. The printed circuit board according to claim 1, wherein circuit electronics and/or power electronics are disposed on said printed circuit board.

3. The printed circuit board according to claim 1, wherein said precision resistor satisfies at least one of the following requirements:
   (a) Said precision resistor comprises a resistance value in the range from 0.1 to 300 milliohms
   (b) Said precision resistor comprises a variance of less than +/−5%
   (c) The temperature coefficient of the electrical resistance of said precision resistor for the temperature range between 20 and 60° C. is in the range from 0.1 ppm/K to 200 ppm/K
   (d) Said precision resistor is made of metal (e) Said upper sides of said printed circuit board and of said precision resistor are each aligned parallel to each other
(f) Said precision resistor can be manufactured or is manufactured using an extrusion process
(g) Said precision resistor extends substantially in one plane
(h) Said precision resistor comprises a rectangular cross-section
(i) Said precision resistor has a thickness in the range from 10 to 2000 pm.

4. The printed circuit board according to claim 1, wherein said printed circuit board comprises a voltage measuring device that satisfies at least one of the following requirements:
   (a) Said voltage measuring device is adapted to measure a voltage at said connection points
   (b) Said voltage measuring device realizes an HDI (High Density Interconnect) circuit.

5. A method for manufacturing a printed circuit board with at least two connection points and at least one precision resistor extending in said printed circuit board and being configured as a conductor wire for measuring a current flowing between said connection points, comprising the steps of:
   (a) Welding said precision resistor to said connection points
   (b) Embedding said precision resistor into a layer of insulating material so that an underside, all edge sides and a major part of an upper side of said precision resistor are entirely covered with insulating material and the upper side of said precision resistor extends at least in sections flush with an upper side of said layer of insulating material, wherein said upper side of said precision resistor and said upper side of said layer of insulating material face towards the same direction
   (c) Electrically insulating said connection points from each other so that a current flowing between said connection points flows through said precision resistor, wherein an underside of said connection points contacts the upper side of said precision resistor and the upper side of said layer of insulating material, while an upper side of said connection points contacts neither said precision resistor nor said layer of insulating material.

6. The method according to claim 5, further comprising at least one of the following steps:
   (a) Pressing a prepreg made of insulating material to said precision resistor
   (b) Working out said connection points by way of etching from a copper foil attached to the surface of said printed circuit board
   (c) Manufacturing a voltage measuring device on said printed circuit board, with at least one of the following steps:
      (i) Producing a bore for connecting said precision resistor through at least one layer of insulating material
      (ii) Connecting said precision resistor through at least one layer of insulating material
      (iii) Galvanically connecting said precision resistor.

* * * * *